US008698495B2

(12) United States Patent
Nehrke et al.

(10) Patent No.: US 8,698,495 B2
(45) Date of Patent: Apr. 15, 2014

(54) FLIP ANGLE IMAGING WITH IMPROVED B1 MAPPING FOR MULTI-RF TRANSMIT SYSTEMS

(75) Inventors: Kay Nehrke, Hamburg (DE); Peter Boernert, Hamburg (DE); Tobias Ratko Voigt, Hamburg (DE); Ulrich Katscher, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 624 days.

(21) Appl. No.: 12/933,897

(22) PCT Filed: Mar. 26, 2009

(86) PCT No.: PCT/IB2009/051258
§ 371 (c)(1),
(2), (4) Date: Sep. 22, 2010

(87) PCT Pub. No.: WO2009/118702
PCT Pub. Date: Oct. 1, 2009

(65) Prior Publication Data
US 2011/0026799 A1     Feb. 3, 2011

(30) Foreign Application Priority Data

Mar. 27, 2008   (EP) ...................................... 08153373

(51) Int. Cl.
*G01V 3/00*     (2006.01)
(52) U.S. Cl.
USPC ........................................................ 324/309
(58) Field of Classification Search
USPC .................................................. 324/300–322
See application file for complete search history.

(56) References Cited

U.S. PATENT DOCUMENTS

| | | | | |
|---|---|---|---|---|
| 6,249,121 B1 * | 6/2001 | Boskamp et al. | ............. | 324/318 |
| 6,989,673 B2 * | 1/2006 | Zhu | ............. | 324/318 |
| 7,075,301 B2 * | 7/2006 | Zhu | ............. | 324/318 |
| 7,218,113 B2 * | 5/2007 | Feiweier et al. | ............. | 324/320 |
| 7,282,914 B2 * | 10/2007 | Morich et al. | ............. | 324/318 |

(Continued)

FOREIGN PATENT DOCUMENTS

| | | |
|---|---|---|
| WO | 2005022184 A1 | 3/2005 |
| WO | 2007098011 A2 | 8/2007 |

OTHER PUBLICATIONS

Nehrke et al: "Improved B1-Mapping for Multi RF Transmit Systems"; Proceedings of the International Society for Magnetic Resonance in Medicine, vol. 16, 2008, p. 353.

(Continued)

*Primary Examiner* — Dixomara Vargas

(57) ABSTRACT

A magnetic resonance method includes performing a plurality of magnetic resonance excitation operations each using a different sub-set of a set of radio frequency transmit coils (30), each sub-set including more than one radio frequency transmit coil, acquiring magnetic resonance data responsive to each said magnetic resonance excitation operation, and computing a B1 or flip angle map for each radio frequency transmit coil of the set of radio frequency transmit coils based on the acquired magnetic resonance data. A magnetic resonance method includes performing an actual flip angle mapping (AFI) sequence using a radio frequency transmit coil (32) with a ratio $TR_1:TR_2$ of the TR times of the AFI sequence selected to be rational, acquiring magnetic resonance data responsive to said AFI sequence, and computing a B1 or flip angle map for the radio frequency transmit coil based on the acquired magnetic resonance data.

13 Claims, 7 Drawing Sheets

(56) References Cited

U.S. PATENT DOCUMENTS

| | | | |
|---|---|---|---|
| 7,385,396 B2* | 6/2008 | Zhu | 324/309 |
| 7,446,526 B2* | 11/2008 | Cunningham et al. | 324/307 |
| 7,550,973 B2* | 6/2009 | Greim et al. | 324/309 |
| 7,633,293 B2* | 12/2009 | Olson et al. | 324/318 |
| 7,659,719 B2* | 2/2010 | Vaughan et al. | 324/318 |
| 7,714,578 B2* | 5/2010 | Weiss | 324/318 |
| 7,800,368 B2* | 9/2010 | Vaughan et al. | 324/318 |
| 7,898,252 B2* | 3/2011 | Crozier et al. | 324/307 |
| 2005/0083054 A1 | 4/2005 | Feiweier et al. | |
| 2005/0140369 A1 | 6/2005 | Feiweier et al. | |
| 2005/0189940 A1 | 9/2005 | Feiweier et al. | |
| 2007/0057673 A1 | 3/2007 | Nayak et al. | |
| 2007/0085537 A1 | 4/2007 | Feiweier | |

OTHER PUBLICATIONS

Zur et al: "Spoiling of Transverse Magnetization in Steady-State Sequences"; Magnetic Resonance in Medicine, vol. 21, 1991, pp. 251-263.

Busse, R.: "Flip Angle Calculation for Consistent Contrast in Spoiled Gradient Echo Imaging"; Magnetic Resonance in Medicine, vol. 53, Issue 4, pp. 977-980, 2005.

Yarnykh, V.: "Actual Flip-Angle Imaging in the Pulsed Steady State: A Method for Rapid Three-Dimensional Mapping of the Transmitted Radiofrequency Field"; Magnetic Resonance in Medicine, vol. 57, 2007, pp. 192-200.

Yarnykh: "Actual Flip Angle Imaging in the Pulsed Steady State"; Magnetic Resonance in Medicine, 2004, vol. 11, p. 194.

* cited by examiner

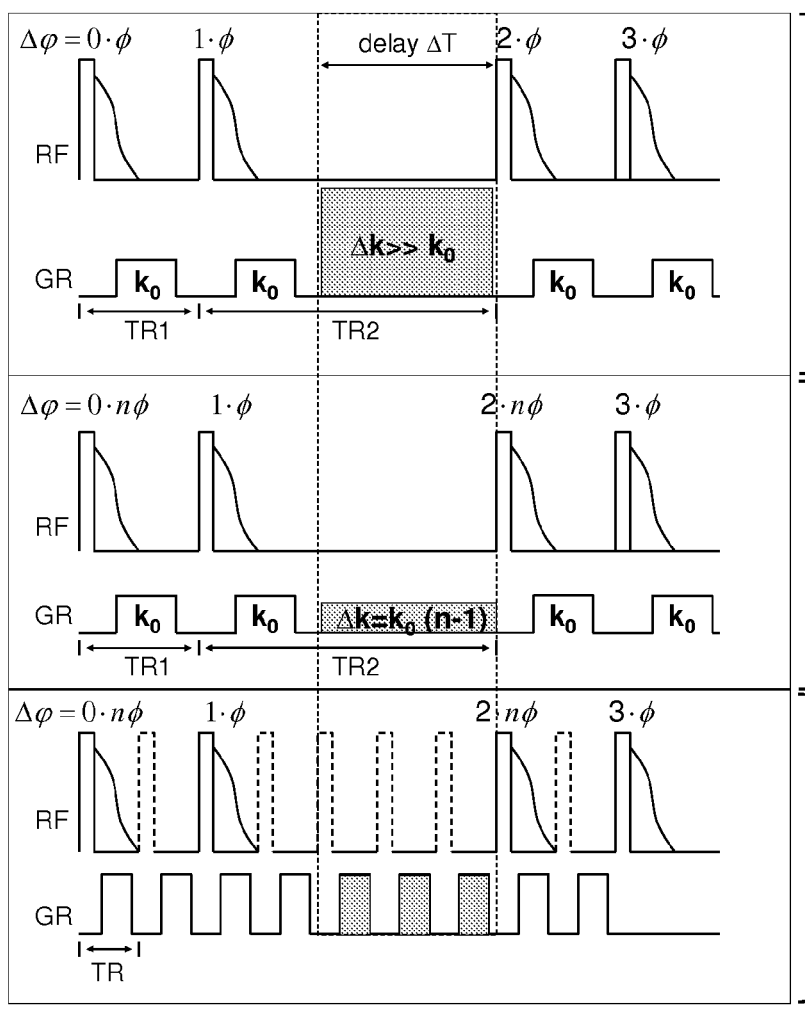

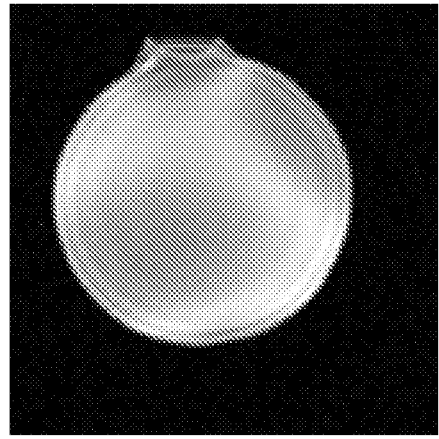
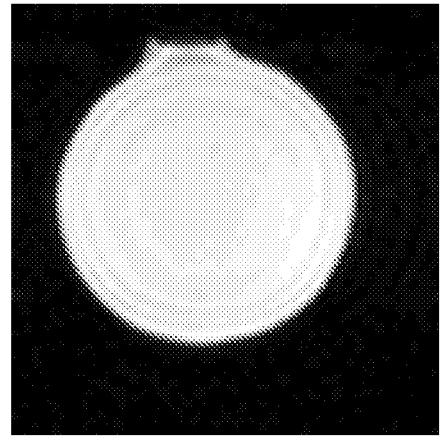
Fig. 7        Fig. 8
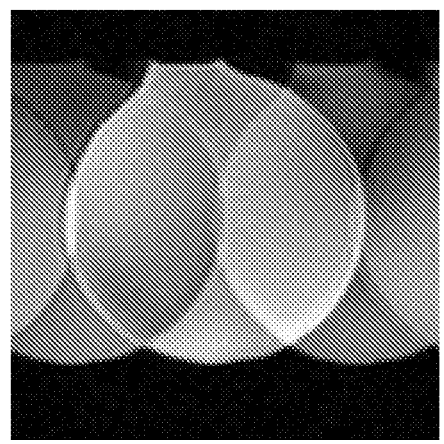
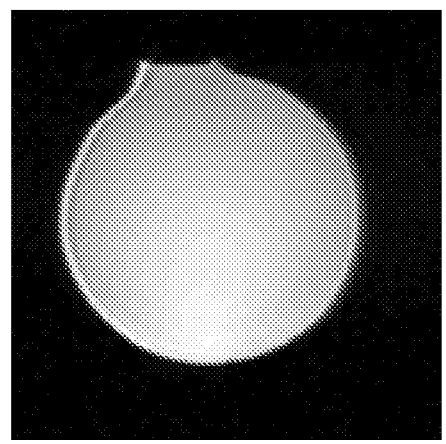
Fig. 9        Fig. 10

FLIP ANGLE IMAGING WITH IMPROVED B1 MAPPING FOR MULTI-RF TRANSMIT SYSTEMS

FIELD OF THE INVENTION

The following relates to the magnetic resonance arts. It finds application in magnetic resonance imaging, and is described with particular reference thereto. However, the following will find application in magnetic resonance generally, including in magnetic resonance imaging, magnetic resonance spectroscopy, and so forth.

BACKGROUND OF THE INVENTION

Multiple radio frequency (RF) transmit coils are used for diverse magnetic resonance applications such as imaging or spectroscopy. For example, image quality can be improved by using multiple RF transmit coils in conjunction with shimming techniques by which the relative output powers of the various transmit coils are varied in a predetermined manner in order to enhance B1 field uniformity. In this way, multiple transmit coils can provide a relatively larger or more precisely shaped excitation volume with requisite B1 field uniformity as compared with what can be achieved using a single surface transmit coil or a whole body transmit coil.

These applications are predicated upon accurate knowledge of the B1 fields generated by the various transmit coils. It is known that the total B1 field generated by a combination of RF transmit coils is a linear combination or superposition (including both magnitude and phase) of the B1 fields generated by the individual RF transmit coils. The B1 field generated by each individual coil can be empirically quantified by acquiring a B1 field or flip angle map of the generated field in a suitable subject such as a phantom or the subject to be imaged. Due to the superposition principle, these individual coil B1 maps can be employed to determine an optimal combination of RF transmit coils for use in a given application.

A fast B1 mapping technique sometimes referred to as "Actual Flip Angle Mapping" or AFI is known. See Yarnykh et al., "Actual flip angle imaging in the pulsed steady state", Proc. of the 12th Annual Meeting of ISMRM (Kyoto, Japan, 2004)(Abstract 194); Yarnykh, "Actual flip-angle imaging in the pulsed steady state: a method for rapid three-dimensional mapping of the transmitted radiofrequency field", Magn. Reson. Med. vol. 57, pp. 192-200 (January 2007). AFI employs a dual repeat time (TR) steady state gradient echo sequence. The flip angle maps are derived from the images by a simple and robust approximation, which facilitates automatic evaluation on the scanner and in-vivo acquisition of 3D flip angle maps.

However, the performance of existing B1 field or flip angle mapping techniques is less than ideal. Error propagation and other difficulties in the case of small flip angles can be problematic, leading to noise in the B1 field map and potentially unreliable mapping of flip angles below about 15-20°. The AFI mapping technique employs large transverse magnetization spoiling gradients that increase the acquisition times of the AFI sequences, and sensitivity of the AFI mapping technique to gradient imperfections such as those generated by main magnetic field eddy currents can be problematic.

The following provides new and improved apparatuses and methods which overcome the above-referenced problems and others.

SUMMARY OF THE INVENTION

In accordance with one aspect, a magnetic resonance method is disclosed, comprising: performing a plurality of magnetic resonance excitation operations each using a different sub-set of a set of radio frequency transmit coils, each sub-set including more than one radio frequency transmit coil; acquiring magnetic resonance data responsive to each said magnetic resonance excitation operation; and computing a B1 or flip angle map for each radio frequency transmit coil of the set of radio frequency transmit coils based on the acquired magnetic resonance data.

In accordance with another aspect, a magnetic resonance system is disclosed, comprising: means for performing a plurality of magnetic resonance excitation operations each using a different sub-set of a set of radio frequency transmit coils, each sub-set including more than one radio frequency transmit coil; means for acquiring magnetic resonance data responsive to each said magnetic resonance excitation operation; and means for computing a B1 or flip angle map for each radio frequency transmit coil of the set of radio frequency transmit coils based on the acquired magnetic resonance data.

In accordance with another aspect, a magnetic resonance method is disclosed, comprising: performing an actual flip angle mapping (AFI) sequence using a radio frequency transmit coil; acquiring magnetic resonance data responsive to said AFI sequence; and computing a $B_1$ or flip angle map for the radio frequency transmit coil based on the acquired magnetic resonance data.

In accordance with another aspect, a magnetic resonance scanner is disclosed, including at least one radio frequency transmit coil. The scanner is configured to perform the method of the immediately preceding paragraph.

One advantage resides in providing improved $B_1$ field or flip angle mapping accuracy.

Another advantage resides in providing $B_1$ field or flip angle mapping with higher signal to noise ratio.

Another advantage resides in providing faster $B_1$ field or flip angle mapping that is more accurate at low flip angle values.

Still further advantages of the present invention will be appreciated to those of ordinary skill in the art upon reading and understand the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

FIGS. 4, 5, and 6 diagrammatically show three different actual flip angle mapping (AFI) sequences.

FIG. 7 shows a B1 map acquired without the spoiler gradient adjustment disclosed herein.

FIG. 8 shows a B1 map corresponding to that of FIG. 7, but acquired with the disclosed spoiler gradient adjustment.

FIG. 9 shows an AFI image acquired without improved phase cycling disclosed herein.

FIG. 10 shows an AFI image corresponding to that of FIG. 9 but acquired with the disclosed improved phase cycling.

DETAILED DESCRIPTION OF EMBODIMENTS

Figure 1:
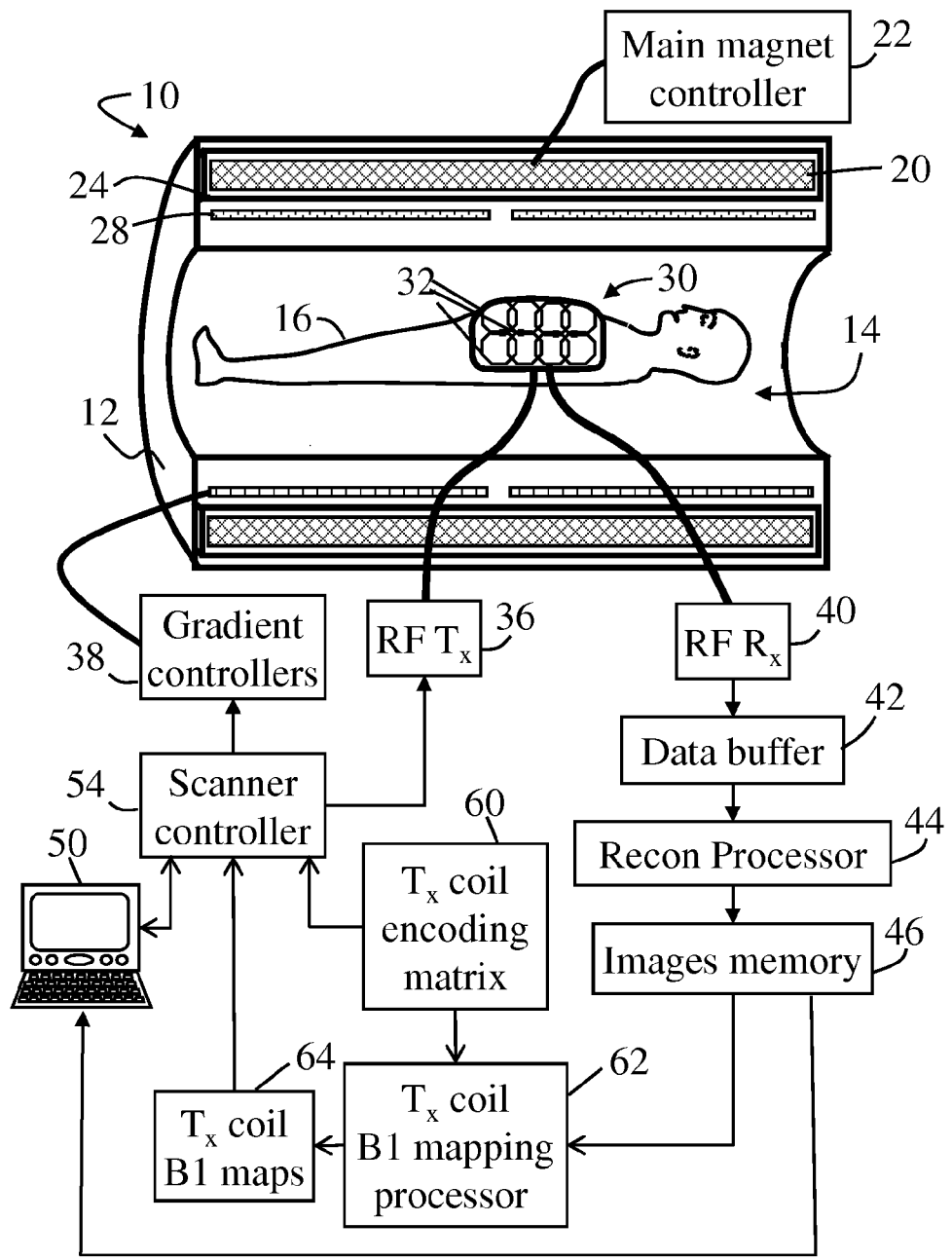
FIG. 1 diagrammatically shows a magnetic resonance system with B1 field or flip angle mapping capability.

With reference to FIG. 1, a magnetic resonance scanner 10 includes a scanner housing 12 including a bore 14 or other receiving region for receiving a patient or other subject 16. A main magnet 20 disposed in the scanner housing 12 is controlled by a main magnet controller 22 to generate a main $B_0$ magnetic field at least in a region of interest of the bore 14. Typically, the main magnet 20 is a persistent superconducting magnet surrounded by cryoshrouding 24, although a resistive, permanent, or other type of main magnet can be used.

Magnetic field gradient coils 28 are arranged in or on the housing 12 to superimpose selected magnetic field gradients on the main magnetic field at least in a region of interest. Typically, the magnetic field gradient coils include coils for producing three orthogonal magnetic field gradients, such as an x-gradient, y-gradient, and z-gradient. A set of radio frequency (B1) coils 30 is disposed in the bore 14 for exciting and receiving magnetic resonance. The set of coils 30 includes a plurality of radio frequency coils 32, such as the illustrated surface coil loops or other type of coils. In the illustrated embodiment the radio frequency coils 32 of the set of coils 30 is physically bound together as a unit; however, it is also contemplated for the radio frequency coils of the set of radio frequency coils to be separate elements not physically bound together as a unit. FIG. 1 shows a single set of coils 30 that is used for both transmit and receive phases of the magnetic resonance acquisition process; however, in other embodiments separate transmit and receive coils or coil sets may be employed.

During magnetic resonance data acquisition, a radio frequency transmitter 36 is coupled to the set of radio frequency coils 30 to generate magnetic resonance signals in a region of interest of a subject disposed in the bore 14. A magnetic field gradients controller 38 operates the magnetic field gradient coils 28 to spatially localize, spatially encode, or otherwise manipulate the generated magnetic resonances. During the magnetic resonance readout phase, a radio frequency receiver 40 coupled with the set of radio frequency coils 30 receives magnetic resonance signals, samples of which are stored in a data buffer 42. Although not illustrated, suitable RF switching is provided to selectively connect the set of radio frequency coils 30 with either the RF transmitter 36 or the RF receiver 40 as appropriate. In other embodiments separate transmit and receive coils or coil sets are contemplated, in which case RF switching is not needed, although in some such embodiments the receive coils may include switched detuning circuitry to detune the receive coil during the RF transmit phase to avoid overloading the receive coils.

The received magnetic resonance samples are processed to produce information of interest. For example, if the magnetic resonance sequence is an imaging sequence that includes spatial encoding by magnetic field gradients, then a reconstruction processor 44 suitably processes the spatially encoded magnetic resonance samples using a Fourier transform reconstruction, backprojection reconstruction, or other reconstruction comporting with the spatial encoding to generate a reconstructed image that is stored in an images memory 46. If the magnetic resonance sequence is a spectroscopy sequence then suitable post-acquisition processing may include, for example, spectral filtering or binning. A user interface 50 displays the reconstructed image or other processed data representation to a user. In the example embodiment illustrated in FIG. 1, the user interface 50 also interfaces the user with a scanner controller 54 to control the magnetic resonance scanner 10. In other embodiments, a separate scanner control interface may be provided.

The magnetic resonance system of FIG. 1 is configured to operate in a multiple coil transmit mode in which a plurality of the radio frequency coils 32 of the set of radio frequency coils 30 are used to generate a radio frequency signal at the magnetic resonance frequency so as to excite magnetic resonance. In some embodiments and magnetic resonance acquisitions, all of the radio frequency coils 32 of the set of radio frequency coils 30 may be used during the transmit phase. To facilitate such multi-RF transmit operation, the scanner controller 54 suitably executes B1 mapping sequences each using a sub-set of radio frequency transmit coils 32 of the set of radio frequency coils 30. The subset for each mapping sequence is suitably determined based on a transmit coil encoding matrix 60. The B1 mapping sequence can be any suitable sequence, such as an actual flip angle mapping (AFI) sequence.

In some embodiments, the sub-set of radio frequency transmit coils 32 used for each mapping sequence is a single radio frequency transmit coil. For example, the transmit coil encoding matrix 60 can be set up so that each one of the radio frequency transmit coils 32 is used in turn to acquire magnetic resonance data used for constructing the B1 map of that radio frequency transmit coil. A suitable set of values for the transmit coil encoding matrix 60 in such a case, for an illustrative example of eight radio frequency transmit coils, is:

$$\overline{A} = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \quad (1)$$

where A denotes the transmit coil encoding matrix 60. In the illustrative matrix formalism used herein, each row corresponds to a B1 mapping sequence acquisition and each column corresponds to one of the coils radio frequency transmit coils 32 of the set of radio frequency coils 30. Thus, the matrix element $A_{i,j}$ denotes the operational state of the jth coil during the ith B1 mapping sequence. A value of $A_{i,j}=1$ indicates that the jth coil is used in the ith B1 mapping sequence, while a value of $A_{i,j}=0$ indicates that the jth coil is not used in the ith B1 mapping sequence. In all such matrices, the ordering of the rows is not significant, that is, the B1 mapping sequence acquisitions can be performed in any order. Moreover, the term "matrix" as used herein is intended to be broadly construed as encompassing any formalism used to represent the operational state of each RF transmit coil of the set of RF transmit coils 30 during each B1 mapping sequence of the plurality of B1 mapping sequences.

It is disclosed herein that substantial improvement in the signal to noise ratio (SNR) of the resultant B1 maps can be obtained by performing at least some B1 mapping sequences using a plurality of the radio frequency transmit coils 32 of the set of radio frequency coils 30 (in conjunction with suitable processing as further disclosed herein), rather than using just a single coil for each sequence. For example, in some embodiments each B1 mapping sequence is performed using all but one radio frequency transmit coil of the set of radio frequency transmit coils 30, as represented for example in the following set of values for the transmit coil encoding matrix 60:

$$\overline{A} = \begin{bmatrix} 0 & 1 & 1 & 1 & 1 & 1 & 1 & 1 \\ 1 & 0 & 1 & 1 & 1 & 1 & 1 & 1 \\ 1 & 1 & 0 & 1 & 1 & 1 & 1 & 1 \\ 1 & 1 & 1 & 0 & 1 & 1 & 1 & 1 \\ 1 & 1 & 1 & 1 & 0 & 1 & 1 & 1 \\ 1 & 1 & 1 & 1 & 1 & 0 & 1 & 1 \\ 1 & 1 & 1 & 1 & 1 & 1 & 0 & 1 \\ 1 & 1 & 1 & 1 & 1 & 1 & 1 & 0 \end{bmatrix} \quad (2)$$

The magnetic resonance data acquired responsive to the ith magnetic resonance excitation sequence is suitably processed to by the reconstruction processor 44 to generate a corresponding B1 or flip angle map denoted herein as in, $\overline{m}_i(x,y)$. A transmit coil B1 mapping processor 62 receives the B1 or flip angle maps $\overline{m}_i(x,y)$ and computes a B1 or flip angle map for each radio frequency transmit coil of the set of radio frequency transmit coils based thereon. The B1 or flip angle map for the jth radio frequency transmit coil is denoted herein as $m_j(x,y)$, and is suitably stored in a transmit coil B1 maps memory 64. The B1 maps $m_j(x,y)$ are suitably used in various applications, such as shimming of the B1 transmit field during multiple transmit coil excitation. The B1 maps can also be displayed on a display of the user interface 50.

The transmit coil B1 mapping processor 62 suitably processes the acquired B1or flip angle maps in, $\overline{m}_i(x,y)$ and computes a B1 or flip angle map for each radio frequency transmit coil of the set of radio frequency transmit coils. Recognizing that the B1 field is the linear combination or superposition of the B1 fields generated by the operating radio frequency transmit coils, and denoting the B1 field map of the jth coil as $m_j(x,y)$, this results in a set of equations of the form:

$$\overline{m}_i(x, y) = \sum_{j=1}^{N} A_{i,j} \cdot m_j(x, y) \quad (3)$$

where N denotes the number of radio frequency transmit coils and corresponds to the number of columns of the transmit coil encoding matrix $\overline{A}$ 60. Enough B1 mapping sequences should be acquired so that the set of Equations (3) can be solved for the B1 field maps $m_j(x,y)$ of the N radio frequency transmit coils. The resulting set of equations is suitably solved for the B1 field maps $m_j(x,y)$ of the N radio frequency transmit coils. For the illustrative coil encoding matrix 60 of Equation (1), it is readily apparent that Equation (3) reduces to $m_j(x,y) = \overline{m}_j(x,y)$, since in that embodiment only a single radio frequency transmit coil is operating during each magnetic resonance excitation sequence.

For embodiments employing the illustrative coil encoding matrix 60 of Equation (2), it can be shown that Equation (3) can be solved analytically to yield the following:

$$m_j(x, y) = \frac{1}{N-1} \cdot \sum_{i=1}^{N} \overline{m}_i(x, y) - \overline{m}_j(x, y) \quad (4)$$

It is to be appreciated that various illustrated components of the system of FIG. 1 can be integrated or divided in various ways. For example, if the user interface 50 is a computer, then the reconstruction processor 44, scanner controller 54, data memories 42, 46, transmit coil encoding matrix 60, transmit coil B1 maps memory 64, or other components are optionally integrated with the user interface 50 as software components, non-volatile memory units, or so forth.

Figure 2:
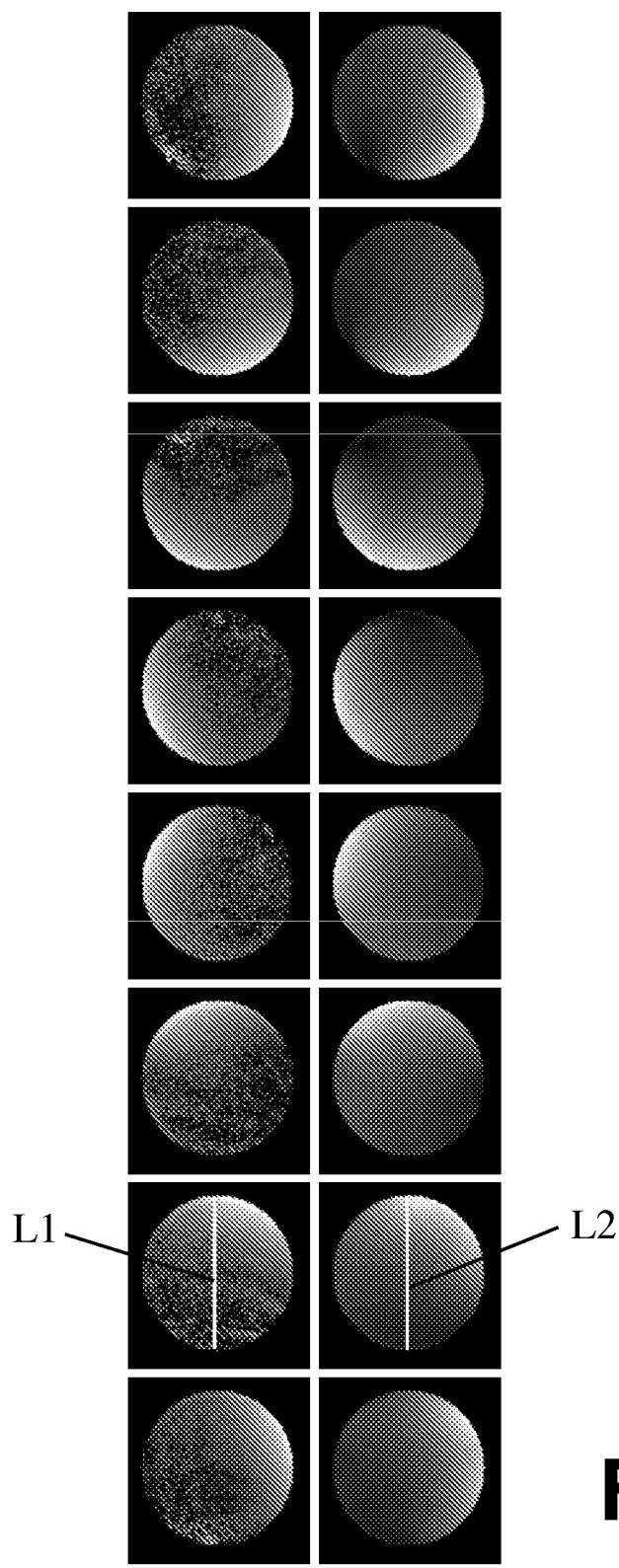
FIG. 2 diagrammatically shows a comparison of B1 maps acquired using two different techniques.
Figure 3:
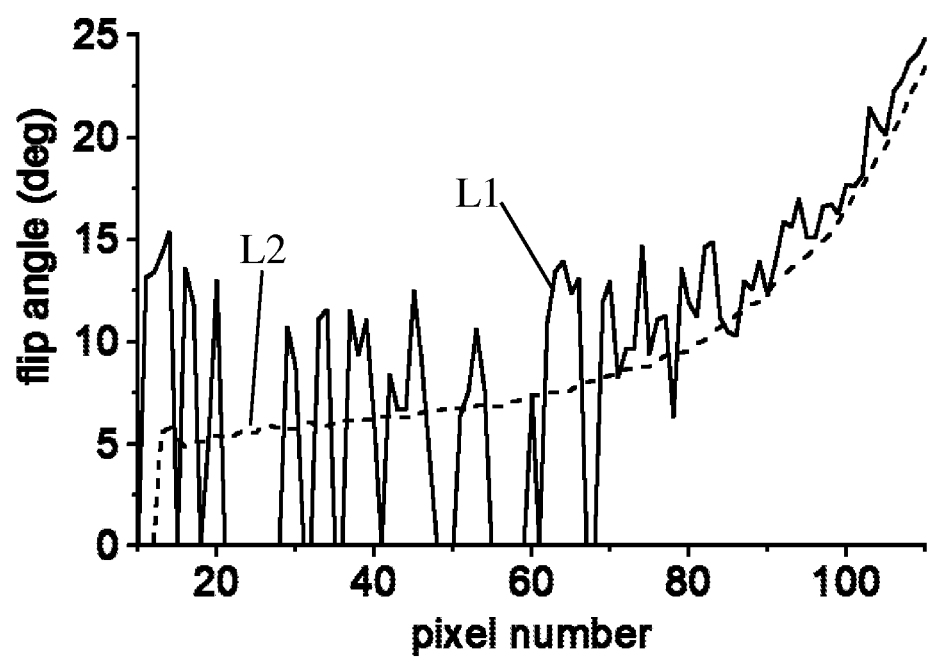
FIG. 3 plots the flip angle in degrees along the vertical lines L1, L2 indicated in the second-from-bottom B1 maps shown in FIG. 2.

With reference to FIGS. 2 and 3, B1 maps for a set of eight radio frequency transmit coils are compared. In FIG. 2, maps obtained by AFI mapping sequences performed using the transmit coils designated by the transmit coil encoding matrix 60 of Equation (1) are shown on the left-hand side, while maps obtained by AFI mapping sequences performed using the transmit coils designated by the transmit coil encoding matrix 60 of Equation (2) are shown on the right-hand side. The latter set of B1 maps exhibit substantially less noise. To provide another mode of comparison, in FIG. 3 the flip angle in degrees is plotted along the vertical lines L1, L2 indicated in the second-from-bottom B1 maps shown in FIG. 2. The plots of FIG. 3 show that the B1 map acquired using only the single transmit coil (that is, in accordance with the transmit coil encoding matrix 60 of Equation (1)) is substantially noisier than the B1 map derived from a plurality of acquisitions each using all but one of the transmit coils (that is, in accordance with the transmit coil encoding matrix 60 of Equation (2)). The noise in the former case is sufficiently high that flip angle values below about 15-20° are not reliable.

Because of the linearity of the transmit system, the coil basis functions used for multi-transmit applications such as RF shimming may be freely chosen. This facilitates adapting the RF field to a favorable operational range of the B1-mapping technique. This recognition underlies the improved B1-maps demonstrated by FIGS. 2 and 3. Typically, basis functions with constructive superposition of the transmit coil sensitivities will be favorable. If reasonable estimates for the phases of the coil elements are not available, signal cancellation may occur and spoil the quality of the maps. In this case, the phases of the coil elements can still be estimated and improved B1-maps can be acquired in a second iteration.

As another contemplated variation, the transmit coil encoding matrix 60 may in some embodiments include values other than 0 and 1. The value of matrix element $A_{i,j}$ denotes the operational state of the jth coil during the ith B1 mapping sequence. In some embodiments, the value of matrix element $A_{i,j}$ represents the operational power of the jth coil during the ith B1 mapping sequence. For example, in a normalized form $A_{i,j}=1$ can represent operation of the jth coil at full or maximum power during the ith B1 mapping sequence, $A_{i,j}=0$ can represent operation of the jth coil at no power (that is, non-operation) during the ith B1 mapping sequence, while an intermediate value such as $A_{i,j}=0.5$ can represent operation of the jth coil at half power during the ith B1 mapping sequence.

The approach of using a subset which is a plurality of radio frequency transmit coils of the set of radio frequency transmit coils 30 for each B1 mapping magnetic resonance excitation sequence or operation is generally applicable for any B1 mapping technique. In some preferred embodiments, the AFI mapping technique is employed.

It is also disclosed herein that improvement in the B1 mapping can be obtained by using certain modifications or improvements on the AFI mapping technique.

With reference to FIG. 4, the AFI sequence is suitably regarded as a spoiled gradient echo sequence, in which for every second repetition time TR an additional time delay $\Delta T$ is interleaved, resulting in effective repetition times $TR_1$ and $TR_2 \geq TR_1$, respectively. Assuming complete spoiling of transverse magnetization, the flip angle α may be estimated from the ratio of the MR signals $S_1$ and $S_2$ acquired in the intervals $TR_1$ and $TR_2$, respectively:

$$\alpha \approx \arccos\frac{rn-1}{n-r}, \quad r = S_2/S_1, \quad n = TR_2/TR_1 \qquad (5)$$

To spoil transverse magnetization, conventional RF spoiling is suitably applied:

$$\phi_k - \phi_{k-1} = k\phi \qquad (6)$$

See, e.g. Zur et al., "Spoiling of transverse magnetization in steady-state sequences", Magn. Reson. Med. vol. 21 pp. 251-63 (1991). In Equation (6) the symbol $\phi_k$ denotes the phase of the kth RF pulse and ϕ is an arbitrarily chosen phase, which determines the spoil characteristics. In addition, a strong spoiling gradient, resulting in a large gradient area Δk, is applied to facilitate diffusion dephasing of remaining coherencies in the presence of off-resonance.

With reference to FIG. 5, an improved spoiling approach is disclosed which employs lower gradients and is more robust against off-resonance effects. The spoiling gradient area in the delay sequence is chosen according to the relation:

$$\Delta \bar{k} = \bar{k}_o \Delta T / TR_1 \text{ with } \bar{k}_o = \gamma \int_0^{TR_1} \bar{G}(t)dt \qquad (7)$$

where γ is a gyrometric ratio, $TR_1$ denotes a first TR time of the AFI sequence, $\bar{G}(t)$ denotes the applied spoiling gradient as a function of time t, and ΔT denotes the delay time of the AFI sequence. The selection of Equation (7) results in a concerted impact of unbalanced gradients and static field inhomogeneities on the phase evolution of the sequence, which enhances robustness against off-resonance. The phase evolution due to both unbalanced gradients and static inhomogeneities is essentially linear in time when the relation of Equation (7) is satisfied. In this case, the RF spoil phase is suitably incremented according to:

$$\phi_k - \phi_{k-1} = nk\phi \text{ for even } k$$

$$\phi_k - \phi_{k-1} = k\phi \text{ for odd } k \qquad (8)$$

where ϕ is a preselected phase value, $n=TR_2/TR_1$ denotes the ratio of the TR times of the AFI sequence and "even" and "odd" refer to pulses immediately before and after the shorter of the two TR times of the AFI sequence, respectively. The RF spoil phase increment of Equation (8) preserves the quadratic increase of the spoil phase over time, which is characteristic for RF spoiling. See, e.g. Zur et al., "Spoiling of transverse magnetization in steady-state sequences", Magn. Reson. Med. vol. 21 pp. 251-63 (1991).

With reference to FIG. 6, another improvement in the AFI mapping sequence disclosed herein provides enhanced eddy current steady state uniformity. In this improvement, the intervals $TR_1$ and $TR_2$ are chosen to be commensurate. That is, the intervals $TR_1$ and $TR_2$ are chosen such that their ratio is rational. The AFI sequence is suitably implemented as an equidistant pulse sequence, consisting of real and dummy RF pulses as shown schematically in FIG. 6. Dummy RF pulses are performed with disabled RF transmission, and are diagrammatically indicated in FIG. 6 using dashed lines. In such an embodiment, the gradient history becomes identical for both gradient echoes of the sequence as a result of the cyclic gradient waveforms. This facilitates the formation of a uniform eddy-current steady-state, and improves robustness against gradient imperfections. Still further, the adjustment of the spoiling gradient in the delay sequence in accordance with Equation (7) is readily achieved. Proper RF spoiling is readily achieved by applying the conventional spoil scheme according to Equation (6) to both real and dummy pulses, which is equivalent to applying Equation (8) to the real pulses only.

When the disclosed spoiling scheme is employed, the sequence may be regarded as an equidistant pulse sequence as illustrated in FIG. 6, where the dummy RF pulses are diagrammatically indicated using dashed lines. Configuration theory may be employed to calculate the echo signals $S_1$ and $S_2$ as a function of the tissue parameters ($T_1$, $T_2$, diffusion coefficient D) and the sequence parameters ($TR_1$, $TR_2$, flip angle α, spoil phase shift increment ϕ, diffusion weighting factor b). Hence, the accuracy of the technique can be predicted as a function of these parameters. Accordingly, the AFI sequence can be optimized with respect to the desired application.

AFI with the disclosed improvements has been implemented based on a standard, 2D or 3D $T_1$-weighted gradient echo sequence. Two images were acquired in an interleaved fashion in the intervals $TR_1$ and $TR_2$, respectively. In accordance with the sequence of FIG. 6, the delay ΔT was realized by interleaving an arbitrary number of dummy pulses with disabled RF transmission and reception. In this way, a suitable adjustment of both the RF spoiling scheme and the gradient areas is readily achieved. In addition, as a result of the periodic gradient waveforms, an improved robustness against gradient imperfections such as eddy currents is expected. To induce diffusion damping in a controllable manner, adjustable spoiler gradients were additionally introduced after the readout gradients of each pulse. The $B_1$ or flip angle map was determined pixel-wise according to Equation (5). Phantom experiments were performed for validation of the improved AFI mapping.

With reference to FIGS. 7 and 8, improved off-resonance robustness was achieved with the improved AFI mapping. FIG. 7 shows a B1 map acquired without the disclosed spoiler gradient adjustment, while FIG. 8 shows a corresponding B1 map acquired with the disclosed spoiler gradient adjustment. The latter B1 map exhibits improved off-resonance robustness of the improved AFI sequence.

FIGS. 9 and 10 show AFI images acquired without (FIG. 9) and with (FIG. 10) the improved phase cycling. FIG. 9 exhibits severe ghosting or aliasing, while FIG. 10 exhibits improved steady state formation of the sequence including the improved phase cycling.

Figure 11:
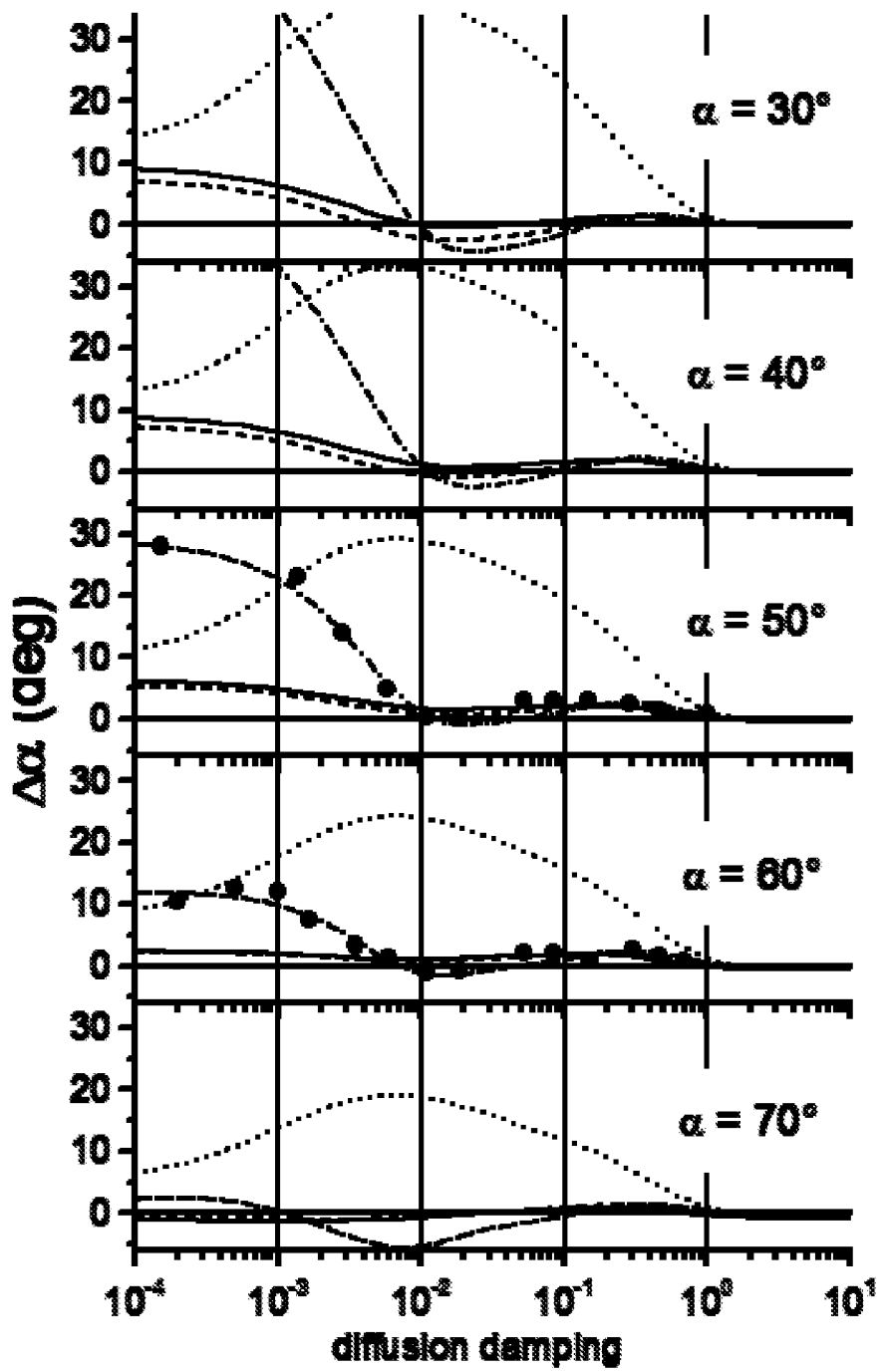
FIG. 11 shows flip angle simulation results along with selected experimental data.

With reference to FIG. 11, simulation software was written to calculate the echo amplitudes $S_1$ and $S_2$ of the AFI sequence as a function of the tissue parameters ($T_1$, $T_2$, diffusion coefficient D) and the sequence parameters ($TR_1$, $TR_2$, flip angle α, spoil phase shift increment ϕ, diffusion weighting factor b). This allows comparison of the predicted flip angle given by Equation (5) and the actual flip angle input into the simulation. Thus, these simulations estimate the accuracy of the improved AFI technique. FIG. 11 shows simulation results along with selected experimental data. In FIG. 11, the deviation between predicted and actual flip angle is plotted as a function of the diffusion damping value d=D·b for five different flip angles. Simulations for different T1, T2 and ϕ are shown. In FIG. 11, solid line denotes T1=10, T2=7, ϕ=129.3°; dashed line denotes T1=60, T2=7, ϕ=129.3°; dotted-dashed line denotes T1=100, T2=100, ϕ=129.3°; dotted line denotes T1=100, T2=100, ϕ=120°, where relaxation times are in units of TR. The solid circles show selected experimental results.

The simulations shown in FIG. 11 are in substantial agreement with the experimental data, indicating that the accuracy of the improved AFI technique may be reliably predicted from the simulation results. Furthermore, the simulations show that the spoil phase shift increment and the spoiling gradient area are preferably adjusted to the tissue parameters and to the expected flip angle range of the employed RF transmit coil. Without such adjustment, systematic errors in the flip angle determination are expected, which may compromise performance. Simulations such as those shown in FIG. 11 are optionally used to optimize the AFI sequence with respect to the chosen application.

One of the above-mentioned tissue parameters that could potentially produce a systematic error in the flip angle estimation is the spin-lattice relaxation time ($T_1$). A further modification to the AFI mapping technique that could lead to improvement in $B_1$ mapping is disclosed herein, wherein the modified AFI mapping technique determines transmit sensitivity independent of $T_1$, and thus, has no corresponding systematic error. An added advantage of this modified AFI mapping technique is that it also provides a $T_1$ map without requiring additional acquisition time.

Figure 12:
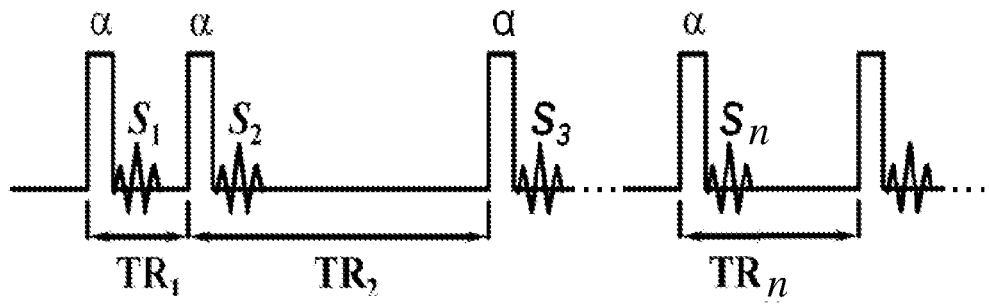
FIG. 12 diagrammatically shows a modified, generalized AFI sequence.

FIG. 12 shows the modified steady state AFI sequence referred to in the preceding paragraph, consisting of an arbitrary number N of repetition times ($TR_1, TR_2, \ldots TR_n$), where $n \in \{1, \ldots N\}$, $N \geq 2$. Each RF pulse is applied with the same flip angle $\alpha$. After each pulse with the flip angle $\alpha$, a corresponding signal ($S_1, S_2 \ldots S_n$), $n \in \{1, \ldots N\}$ is acquired via gradient echo refocusing. An analytical expression for the acquired signal is fitted numerically to the data obtained from the scanner. The resulting parameters obtained from the numerical fit reflect the actual flip angle, which is proportional to the transmit field $H^+$, relaxation time $T_1$, and equilibrium magnetization $M_0$, which includes $T_2^*$ contrast. There is no need to apply the repetition times in a certain order, e.g., $TR_i > TR_j$ for $i > j$. Particularly, $TR_1$ (i.e., the repetition time between the first two pulses applied in the AFI sequence) does not need to be the shortest of the TR times. In general, a (non-cyclic) reordering of the TRs leads to a different set of signals. To apply the above-described RF spoiling scheme for this multiple-TR AFI, it is to be noted that the mutual ratio of each pair of TR times in the set of TR times [$TR_1, TR_2, \ldots TR_n$], where $n \in \{1, \ldots, N\}$, $N \geq 2$, should be a rational number. In other words, each ratio $TR_2:TR_1$, $TR_3:TR_1$, $TR_3:TR_2$, etc., should be rational. However, if the above-described RF spoiling scheme is not considered, the multiple-TR AFI mapping sequence may also be performed with non-rational TRs.

The analytical expression of the gradient-echo signal $S_n$ can be derived from Bloch's equation as:

$$S_n = e^{-\frac{TE}{T_2}} M_0 M_{z,n-1} \quad (9)$$

where $M_0$ is the equilibrium magnetization. The normalized steady state magnetization of the $n^{th}$ signal (i.e., the magnetization reached right before the $S_{n+1}$ pulse) is given by:

$$M_{z,n} = \sin\alpha \cdot \frac{\sum_{j=1}^{N} \left[ \cos^{(N-j)}(\alpha) \cdot (1 - E_{mod(j+n-1,N)+1}) \prod_{k=j+1}^{N} E_{mod(k+n-1,N)+1} \right]}{1 - \cos^N(\alpha) \cdot \prod_{j=1}^{N} E_j} \quad (10)$$

with $E_n = e^{-TR_n/T_1}$. The function $mod(i,N)$ describes the modulus with basis N (i mod N). The analytical expressions given by Equations (9) and (10) are based on the assumption that there is no remaining transverse magnetization at the time of the next pulse (i.e., perfect spoiling).

The standard dual-TR AFI sequences (N=2) depicted in FIGS. 4 and 5 may be repeated more than once (P>1) during a single experiment. Similarly, the modified AFI sequence depicted in FIG. 12 may also be repeated P>1 times with different sets of repetition times $TR_n$. This modified AFI mapping sequence with $N \geq 2$ and $P \geq 1$ is hereinafter referred to as the generalized AFI mapping sequence. From the MR data collected, a curve-fitting algorithm such as the Marquardt-Levenberg algorithm may be used to obtain the parameters $\alpha$ and $T_1$. The fitting is performed by comparing the N×P measured signals $S_n$ to the analytical expressions in Equations (9) and (10), according to the expression:

$$S(TR_1 \ldots TR_n, TE, T_2^*; T_1, \alpha, M_0) = \tilde{M}_0(T_2^*, TE, M_0) \cdot M_z(TR_1 \ldots TR_n, \alpha, T_1) \quad (11)$$

It may be noted that $\tilde{M}_0$ is a linear factor and contains information from $T_2^*$, TE and $M_0$, and acts only as a global scaling factor.

At least three images (N×P=3) would be required by the curve-fitting algorithm to determine the three unknown parameters $\tilde{M}_0$, $T_1$ and $\alpha$. Using the disclosed technique, a single measurement with P=1 and N=3 is theoretically sufficient to perform the curve fitting. However, in order to stabilize the fit (i.e., to enhance SNR) and extract parameters more accurately, more images (i.e., N×P>3) may be acquired, for example using more than one measurement (i.e., P>1), with the same or different sets of $TR_n$.

As an alternative to the numerical fitting procedure outlined above, a generalized analytical approach modified from the analytical approach for standard, dual-TR AFI may be used. Specifically, by computing the ratio of any two signals, the interdependence between $M_0$ and $T_2$ in Equation (11) may be removed by:

$$\frac{S_{i+1}}{S_{j+1}} = r_{i+1,j+1} \quad (12)$$

Inserting the analytical form for the signal equations (9) and (10) and using the approximation $$\frac{TR_i}{T_1} \ll 1$$

yields:

$$\sum_{k=1}^{N} \cos^{(N-k)}(\alpha) [r_{i+1,j+1} TR_{mod(k+j-1,N)+1} - TR_{mod(k+i-1,N)+1}] = 0 \quad (13)$$

The above polynomial of grade N−1 can be solved for the flip angle $\alpha$ since it does not contain any other unknown quantities. In general, if each $TR_n$ is unique and therefore different from other $TR_n$, $$\binom{N}{2}$$

ratios like those shown in Equation (12) can be computed, yielding the same number of polynomials. Each polynomial has N−1 solutions for $\alpha$, not all of which are physically meaningful. In the case of N=2, Equation (13) reduces to the standard AFI case while in the case of N=3, Equation (13)

becomes a quadratic function, which again can be solved analytically. It is found for the ratio $S_3/S_1$:

$$\alpha_1^{3,1} = \arccos\left(-\frac{r_{3,1}TR_2 - TR_1}{2(r_{3,1}TR_1 - TR_3)} + \sqrt{\frac{(r_{3,1}TR_2 - TR_1)^2}{4(r_{3,1}TR_1 - TR_3)^2} - \frac{r_{3,1}TR_3 - TR_2}{r_{3,1}TR_1 - TR_3}}\right)$$

$$\alpha_2^{3,1} = \arccos\left(-\frac{r_{3,1}TR_2 - TR_1}{2(r_{3,1}TR_1 - TR_3)} - \sqrt{\frac{(r_{3,1}TR_2 - TR_1)^2}{4(r_{3,1}TR_1 - TR_3)^2} - \frac{r_{3,1}TR_3 - TR_2}{r_{3,1}TR_1 - TR_3}}\right)$$

The calculation for the ratio $S_2/S_1$ yields:

$$\alpha_1^{2,1} = \arccos\left(-\frac{r_{2,1}TR_2 - TR_3}{2(r_{2,1}TR_1 - TR_2)} + \sqrt{\frac{(r_{2,1}TR_2 - TR_3)^2}{4(r_{2,1}TR_1 - TR_2)^2} - \frac{r_{2,1}TR_3 - TR_1}{r_{2,1}TR_1 - TR_2}}\right)$$

$$\alpha_2^{2,1} = \arccos\left(-\frac{r_{2,1}TR_2 - TR_3}{2(r_{2,1}TR_1 - TR_2)} - \sqrt{\frac{(r_{2,1}TR_2 - TR_3)^2}{4(r_{2,1}TR_1 - TR_2)^2} - \frac{r_{2,1}TR_3 - TR_1}{r_{2,1}TR_1 - TR_2}}\right)$$

It is evident that a mechanism has to be used to discard non-physical solutions, e.g., considering only that solution which is closest to the nominal flip angle set in the scan parameters. It may be noted that this approach produces a systematic $T_1$-dependent error, as in the case of standard, dual-TR AFI.

In general, the sequence shown in FIG. 12 with N=2 repetition times (i.e., $TR_1$, $TR_2$), and applied only once (i.e., P=1) results in the standard AFI approach. As mentioned earlier, the standard AFI sequence is based on two identical RF pulses with the same flip angle, with each of the pulses being followed by a different repetition time (i.e., $TR_1$ and $TR_2$). It is to be noted that $T_1$ cannot be determined by this method.

As a specific example of the improved, generalized AFI method disclosed herein, the sequence shown in FIG. 12 with N=2 repetition times, and applied more than once (i.e., P>1) is further discussed herein. This form of the generalized sequence is different from simply applying the standard AFI sequence multiple times in that it employs subsequent measurements with different TR combinations (for example, $TR_1$ and $TR_2$ for P=1, $TR_3$ and $TR_4$ for P=2, etc.). It is possible that one of the two TR values (but not both) in a particular sequence may be the same for different values of P. The analytical expression of the two gradient-echo signals $S_1$ and $S_2$ can be derived from Bloch's equation as:

$$S_{1,2} = M_{z1,2} e^{-\frac{TE}{T_2^*}} \sin\alpha \tag{12}$$

The equilibrium magnetization of the first signal, i.e., the magnetization reached right before the $S_2$ pulse is given by:

$$M_{z1} = M_0 \frac{1 - E_2 + (1 - E_1)E_2\cos\alpha}{1 - E_1 E_2 \cos^2\alpha} \tag{13}$$

with $E_{1,2} = e^{-TR_{1,2}/T_1}$. $M_{z2}$ can be obtained from Eq. (13) by interchanging the indices (1↔2), which is equivalent to swapping $TR_1$ and $TR_2$. As in the generalized case, all analytical expressions are based on the assumption that there is no remaining transverse magnetization at the time of the next pulse (i.e., perfect spoiling). The standard AFI technique derives the actual flip angle by dividing $S_2$ by $S_1$ and rearranging the resulting equation (Equations 12 and 13). Mathematically, there is a simplification involved in this approach. The functions $E_1$ and $E_2$ are approximated by a first order Taylor series, assuming $TR_1/T_1 \ll 1$ and $TR_2/T_1 \ll 1$. This means that the condition $TR_1 < TR_2 \ll T_1$ has to hold good in all cases. In human tissue however, $T_1$ ranges from approximately 250 ms (fat) to 4500 ms (CSF) at 1.5 T and thus cannot be neglected for TRs typically up to a few hundred milliseconds, as otherwise, this could lead to the systematic error mentioned earlier.

The improved method disclosed herein employs Equations (12) and (13) as a model that is used for fitting data points. The data points are the measured signals $S_1$ and $S_2$. A non-linear fit algorithm, for example the Levenberg-Marquardt algorithm as mentioned in the generalized case, is used to determine the desired parameters, namely the flip angle $\alpha$ and $T_1$. Often, the curve-fitting algorithm aims to minimize least square differences from the measurement using a maximum neighbourhood method. In this case, the function to be fitted to the measured signal is a function of various variables and parameters, given by:

$$S(TR_1,TR_2,TE,T_2^*;T_1,\alpha,M_0) = S(TR_1,TR_2,\tilde{M}_0(T_2^*,TE,M_0),\alpha,T_1) = \tilde{M}_0(T_2^*,TE,M_0) \cdot F(\alpha,T_1)$$

Comparing this to Equations (12) and (13) for $S_1$ yields:

$$F(\alpha, T_1) = \frac{(1-E_2)\sin\alpha + \frac{1}{2}(1-E_1)E_2\sin 2\alpha}{1 - E_1 E_2 \cos^2\alpha} \text{ and } \tilde{M}_0 = M_0 \cdot e^{-TE/T_2^*} \tag{14}$$

As mentioned earlier, $S_2$ can be obtained from Equation (14) by interchanging the indices 1 and 2. $TR_1$ and $TR_2$ are preset in each experiment and are thus known. The other parameters, $\alpha$ and $T_1$, are obtained by the numerical fit. $\tilde{M}_0$ is a linear factor and contains information from $T_2^*$, TE, and $M_0$, and acts only as a global scaling factor.

As mentioned in the generalized case, the curve-fitting algorithm requires at least three data points to yield a fit based on the three unknown parameters, $\tilde{M}_0$, $T_1$ and $\alpha$. This means that using the dual-TR sequence (N=2), at least two different TR combinations (i.e., P≥2) are needed to ensure N×P≥3. Each $TR_N$ sequence, where N=2, gives two data points $F(TR_1, TR_2, \alpha, T_1)$ and $F(TR_2, TR_1, \alpha, T_1)$ from signals $S_1$ and $S_2$ and thus at least four images are acquired. In order to conduct the fit, the partial derivatives of S with respect to the three parameters (i.e., $\alpha$, $\tilde{M}_0$, and $T_1$) have to be provided.

Simulations were conducted to compare the improved AFI sequence proposed herein with the standard AFI sequence. Simulated images of 30×30 pixels with constant signal were investigated using the standard AFI sequence (N=2, P=1) and two implementations of the improved AFI sequence:
Implementation 1: N=2, P=2 to 4
Implementation 2: N=3, P=1 to 3

The signal was computed according to Equation (9) ($T_1$=600 ms, $T_2^*$=50 ms, TE=2.7 ms, $M_0$=100) and superimposed with random noise of maximum amplitude of $M_0$/SNR (SNR=80). Images were simulated using various excitation flip angles $\alpha$=40°, 50°, ... 140°, in steps of 10° to find the optimum flip angle separately for standard AFI and the two implementations for improved AFI. A maximum profile duration sum $T_{max}=\Sigma_i TR_i=P\times 250$ ms has been used as a limitation of test parameter space. Within this space, all possible combinations of repetition times $TR_n$ in steps of 20 ms were reconstructed with both the standard and improved AFI sequences.

The absolute difference between the mean value of the resulting flip angle map and the input value for α serves as a measure for systematic errors. As $T_1$ effects are neglected in the standard AFI mapping technique, it suffers from a systematic error that depends, among other parameters, on α. It may be noted that the improved AFI mapping is not affected by systematic errors stemming from $T_1$ effects. Experiments with multi-$T_1$ phantoms showed systematic errors of several degrees in agreement with corresponding simulations.

Figure 13:
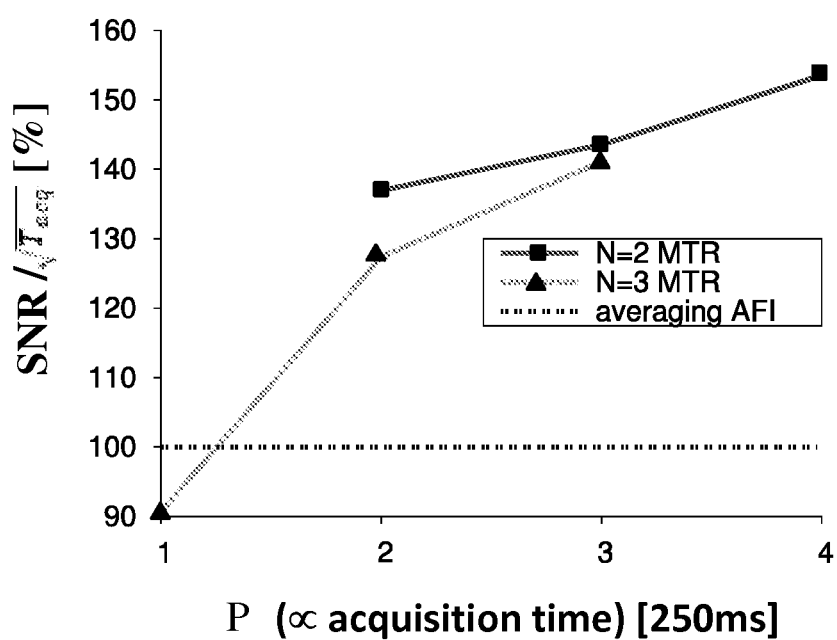
FIG. 13 shows a comparison of signal to noise ratio of standard AFI mapping vs. the generalized AFI mapping method proposed herein.

FIG. 13 shows a comparison of signal-to-noise ratio (divided by square root of imaging time) of standard AFI mapping vs. two implementations of the improved, generalized AFI mapping method proposed herein. The triangles illustrate the implementation with N=3 and P=1 to 3, while the squares illustrate the implementation with N=2 and P=2 to 4. The dotted line shows the standard AFI sequence averaged P number of times so as to retain the same acquisition time for comparison purposes, normalized to 100%.

It can be seen that taking two dual-TR pairs (N=2, P=2) with a maximum profile duration sum of $T_{max}$=500 ms. yields an increase of SNR by 37% compared to averaging two standard AFI images, while for fitting an N=2 TR sequence with P=3, an SNR gain of 41% compared to standard AFI is obtained. Increasing P=4 yields a SNR gain of 53% over an averaged AFI sequence taking the same acquisition time. Similarly, for the implementation with N=3 TR pairs, a value of P=2 provides a SNR gain of 28%, while at P=3, the SNR gain increases to 38% over the averaged, standard AFI sequence. It is to be noted that $T_{max}$ is only the sum of different TRs (i.e., one "profile"), and need not be the total pulse sequence time, which is obtained typically by multiplying $T_{max}$ with the number of phase encoding steps.

In some embodiments, the improved AFI sequence is contemplated to be automatically optimized by selecting appropriate sequence parameters for the anatomy to be imaged or mapped and the choice of RF transmit coil or coils. For this purpose, a simulation algorithm can be integrated in to planning software included with or accessed by the scanner controller 54. In another approach, precalculated tables of preferred sequence parameters can be included with or accessible by the scanner controller 54.

The sequence of FIG. 6 includes dummy RF pulses indicated in FIG. 6 by dashed lines, as already mentioned. It is contemplated to acquire additional images corresponding to these dummy RF pulses. Despite the disabled RF transmission, echoes may arise as a result of remaining transverse coherencies. This information could be used to monitor the efficiency of RF spoiling or to derive information on the tissue parameters like $T_2$ or D.

The improved B1 mapping techniques disclosed herein are suitably used for diverse multi-element transmit applications such as RF-shimming. The disclosed techniques are also expected to have other applications. For example, another suitable application is quantitative magnetic resonance imaging. In quantitative magnetic resonance imaging, B1 field inhomogeneity is a substantial error source. The techniques disclosed herein can be used to select a set of radio frequency transmit coils, and optionally coil transmit power levels, that enhance B1 field homogeneity for improved quantitative magnetic resonance imaging. The techniques disclosed herein are further expected to find application in magnetic resonance coil development, for example in determining the transmit sensitivity profile.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance method comprising the acts of:
performing a plurality of magnetic resonance excitation operations each using a different sub-set of a set of radio frequency transmit coils that are physically bound together as a unit, each sub-set including more than one radio frequency transmit coil;
acquiring magnetic resonance data responsive to each said magnetic resonance excitation operation;
computing a B1 or flip angle map for each radio frequency transmit coil of the set of radio frequency transmit coils based on the acquired magnetic resonance data; and
storing the B1 or flip angle map in a memory,
wherein the computing act includes performing mapping sequences using the different sub sets and wherein each of the different sub sets includes all but one different radio frequency transmit coil of the set of radio frequency transmit coils that are physically bound together as a unit.

2. A magnetic resonance method comprising the acts of:
performing a plurality of magnetic resonance excitation operations each using a different sub-set of a set of radio frequency transmit coils, each sub-set including more than one radio frequency transmit coil;
acquiring magnetic resonance data responsive to each said magnetic resonance excitation operation;
computing a B1 or flip angle map for each radiofrequency transmit coil of the set of radio frequency transmit coils based on the acquired magnetic resonance data; and
storing the B1 or flip angle map in a memory,
wherein the computing act comprises:
computing the B1 or flip angle map for the jth radio frequency transmit coil to be the same as or substantially equivalent to a map $m_j(x,y)$ given by:

$$m_j(x, y) = \frac{1}{N-1} \cdot \sum_{i=1}^{N} \overline{m}_i(x, y) - \overline{m}_j(x, y)$$

where N denotes the number of radio frequency transmit coils in the set of radio frequency transmit coils and $\overline{m}_k(x,y)$ denotes a B1 or flip angle map obtained from magnetic resonance data acquired responsive to the magnetic resonance excitation operation performed using a sub-set including all radio frequency transmit coils except the kth radio frequency transmit coil.

3. A magnetic resonance method comprising the acts of:
performing an actual flip angle mapping (AFI) sequence using a radio frequency transmit coil;
acquiring magnetic resonance data responsive to said AFI sequence;
computing a B1 or flip angle map for the radio frequency transmit coil based on the acquired magnetic resonance data; and
storing the B1 or flip angle map in a memory, wherein the performing act comprises:
performing the AFI sequence as an equidistant pulse sequence including real and dummy radio frequency excitation pulses.

4. A magnetic resonance method comprising the acts of:
performing an actual flip angle mapping (AFI) sequence using a radio frequency transmit coil;
acquiring magnetic resonance data responsive to said AFI sequence;
computing a B1 or flip angle map for the radio frequency transmit coil based on the acquired magnetic resonance data; and
storing the B1 or flip angle map in a memory,
wherein the performing of the AFI sequence comprises performing said AFI sequence with a spoiling gradient area chosen to satisfy the condition:

$$\Delta \bar{k} = \bar{k}_o \Delta T / TR_1 \text{ with } \bar{k}_o = \gamma \int_0^{TR_1} \overline{G}(t) dt$$

where $\gamma$ is a gyrometric ratio, $TR_1$ denotes a first TR time of the AFI sequence, $\overline{G}(t)$ denotes the applied spoiling gradient as a function of time t, and $\Delta T$ denotes the delay time of the AFI sequence.

5. The magnetic resonance method as set forth in claim 4, wherein the radio frequency transmit coil comprises a set of radio frequency transmit coils, and the performing and acquiring are repeated a plurality of times each using a different sub-set of the set of radio frequency transmit coils, each sub-set including more than one radio frequency transmit coil, and the computing comprises computing a B1 or flip angle map for each radio frequency transmit coil of the set of radio frequency transmit coils based on the acquired magnetic resonance data.

6. A magnetic resonance method comprising the acts of:
performing an actual flip angle mapping (AFI) sequence using a radio frequency transmit coil;
acquiring magnetic resonance data responsive to said AFI sequence; and
computing a B1 or flip angle map for the radio frequency transmit coil based on the acquired magnetic resonance data; and
storing the B1 or flip angle map in a memory,
wherein the performing of the AFI sequence comprises performing said AFI sequence with a spoiling gradient phase incremented according to:

$\phi_k - \phi_{k-1} = nk\phi$ for even $k$ $\phi_k - \phi_{k-1} = k\phi$ for even $k$ where $\phi$ is a preselected phase value, $n = TR_2/TR_1$ denotes the ratio of two TR times of the AFI sequence and even and odd refer to pulses immediately before and after the shorter of the two TR times of the AFI sequence, respectively.

7. A magnetic resonance method comprising the acts of:
performing an actual flip angle mapping (AFI) sequence using a radio frequency transmit coil;
acquiring magnetic resonance data responsive to said AFI sequence; and
computing a B1 or flip angle map for the radio frequency transmit coil based on the acquired magnetic resonance data; and
storing the B1 or flip angle map in a memory,
wherein a ratio $TR_1:TR_2$ of repetition times of the AFI sequence is selected to be rational.

8. A magnetic resonance method comprising the acts of:
performing an actual flip angle mapping (AFI) sequence using a radio frequency transmit coil;
acquiring magnetic resonance data responsive to said AFI sequence; and
computing a B1 or flip angle map for the radio frequency transmit coil based on the acquired magnetic resonance data; and
storing the B1 or flip angle map in a memory,
wherein the AFI sequence includes an arbitrary number N of repetition time $TR_1, TR_2, \ldots TR_n$, where $n \in \{1, \ldots N\}$, $N \geq 2$.

9. The magnetic resonance method as set forth in claim 8, wherein the repetition times $TR_1, TR_2, \ldots TR_n$ are selected such that the mutual ratio of each pair of repetition times, in the said group of repetition times, is a rational number.

10. The magnetic resonance method as set forth in claim 8, further comprising:
repeating the AFI sequence a plurality of times, wherein at least one TR time of the N repetition times $TR_1, TR_2, \ldots TR_n$, $n \in \{1, \ldots N\}$, $N \geq 2$, is different in each of the plurality of repetitions.

11. The magnetic resonance method as set forth in claim 8, wherein the computing further includes computing a spin-lattice relaxation time $T_1$ based on the acquired magnetic resonance data.

12. A magnetic resonance scanner including at least one radio frequency transmit coil, a processor and a memory coupled to the processor, wherein the processor is configured to perform the acts of:
performing a plurality of magnetic resonance excitation operations each using a different sub-set of a set of radio frequency transmit coils that are physically bound together as a unit, each sub-set including more than one radio frequency transmit coil;
acquiring magnetic resonance data responsive to each said magnetic resonance excitation operation;
computing a B1 or flip angle map for each radio frequency transmit coil of the set of radio frequency transmit coils based on the acquired magnetic resonance data; and
storing the B1 or flip angle map in the memory,
wherein the computing act includes performing mapping sequences using the different sub sets and wherein each of the different sub sets includes all but one different radio frequency transmit coil of the set of radio frequency transmit coils that are physically bound together as a unit.

13. A non-transitory computer readable medium comprising computer instructions which, when executed by a processor, configure the processor to perform the acts of:
performing a plurality of magnetic resonance excitation operations each using a different sub-set of a set of radio frequency transmit coils that are physically bound together as a unit, each sub-set including more than one radio frequency transmit;
acquiring magnetic resonance data response to each said magnetic resonance excitation operation;
computing a B1 or flip angle map for each radio frequency transmit coil of the set of radio frequency transmit coils based on the acquired magnetic resonance data; and
storing the B1 or flip angle map in a memory, wherein the computing act includes performing mapping sequences using the different sub sets and wherein each of the different sub sets includes all but one different radio frequency transmit coil of the set of radio frequency transmit coils that are physically bound together as a unit.

* * * * *